United States Patent
Ido et al.

(10) Patent No.: US 7,115,966 B2
(45) Date of Patent: Oct. 3, 2006

(54) SEMICONDUCTOR DEVICE

(75) Inventors: Yasuhiro Ido, Hyogo (JP); Kazushi Kono, Hyogo (JP); Takeshi Iwamoto, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 209 days.

(21) Appl. No.: 10/375,125

(22) Filed: Feb. 28, 2003

(65) Prior Publication Data

US 2004/0080022 A1    Apr. 29, 2004

(30) Foreign Application Priority Data

Oct. 29, 2002    (JP)    ............................... 2002-314781

(51) Int. Cl.
    H01L 29/00    (2006.01)
    H01L 29/73    (2006.01)
(52) U.S. Cl. ...................................... 257/529; 257/209
(58) Field of Classification Search ............... 257/209, 257/529, 530, 173, 665, 910; 438/132, 215, 438/281, 333, 467, 601
    See application file for complete search history.

(56) References Cited

U.S. PATENT DOCUMENTS

| | | | | |
|---|---|---|---|---|
| 5,235,205 A | * | 8/1993 | Lippitt, III ................... | 257/528 |
| 5,328,865 A | * | 7/1994 | Boardman et al. .......... | 438/600 |
| 5,705,849 A | * | 1/1998 | Zheng et al. ................ | 257/530 |
| 5,986,319 A | * | 11/1999 | Huggins ...................... | 257/529 |
| 6,124,194 A | * | 9/2000 | Shao et al. .................. | 438/600 |
| 6,180,503 B1 | * | 1/2001 | Tzeng et al. ................. | 438/601 |
| 6,265,257 B1 | * | 7/2001 | Hsu et al. .................... | 438/215 |
| 6,333,545 B1 | * | 12/2001 | Ema ............................. | 257/529 |
| 6,362,514 B1 | | 3/2002 | Ido et al. | |
| 6,372,556 B1 | * | 4/2002 | Ko ............................... | 438/132 |
| 6,440,833 B1 | * | 8/2002 | Lee et al. .................... | 438/601 |
| 6,518,494 B1 | * | 2/2003 | Shibuya et al. ............. | 136/261 |
| 6,563,188 B1 | * | 5/2003 | Nagatani ..................... | 257/529 |
| 2003/0085445 A1 | * | 5/2003 | Watanabe .................... | 257/529 |

FOREIGN PATENT DOCUMENTS

| | | |
|---|---|---|
| CN | 85107869 | 6/1996 |
| CN | 1214549 A | 4/1999 |
| JP | 59-84574 | 5/1984 |
| JP | 63-3432 | 1/1988 |
| JP | 02-25055 | 1/1990 |
| JP | 09-17877 | 1/1997 |
| JP | 9-17877 A | 1/1997 |
| JP | 10-242280 | 9/1998 |
| JP | 10-294372 | 11/1998 |
| JP | 11-345880 | 12/1999 |
| JP | P2000-68377 A | 3/2000 |
| JP | P2000-114382 A | 4/2000 |

(Continued)

Primary Examiner—Hung Vu
(74) Attorney, Agent, or Firm—McDermott Will & Emery LLP

(57) ABSTRACT

On a semiconductor substrate a silicon oxide film is formed and provided with a recess. In the recess a reflector layer of copper is disposed as a blocking layer with a barrier metal posed therebetween. The reflector layer of copper is covered with a silicon oxide film and thereon a fuse region provided with a plurality of fuses is provided. The reflector layer of copper has a plane of reflection recessed downward to reflect a laser beam. The reflector layer of copper is arranged to overlap substantially the entirety of the fuse region, as seen in a plane. A laser beam radiated to blow the fuse can have a reduced effect on a vicinity of the fuse region. A semiconductor device reduced in size can be obtained.

2 Claims, 21 Drawing Sheets

FOREIGN PATENT DOCUMENTS

| | | |
|---|---|---|
| JP | 2000-208635 A | 7/2000 |
| JP | P2000-208635 A | 7/2000 |
| TW | 318954 | 11/1997 |

* cited by examiner

SEMICONDUCTOR DEVICE

BACKGROUND OF THE INVENTION

1. Field of the Invention

The present invention relates generally to semiconductor devices and particularly to those comprising a redundant circuit including a fuse.

2. Description of the Background Art

As semiconductor devices are increasingly microfabricated, foreign matters have a significant effect on yields of semiconductor devices. In semiconductor memory devices having memory cells of dynamic random access memory or the like a redundant circuit is used to connect a previously formed, spare, defectless cell in place of a specific cell defective due to foreign matters or the like.

To substitute the defective cell with the defectless cell a fuse provided in the redundant circuit would be blown. The fuse is typically an interconnection layer formed in a portion corresponding to an upper layer of the semiconductor memory device.

Generally a fuse is blown by laser-trimming using a laser beam. The laser beam directed to a specific fuse to illuminate the fuse blows it.

As a first arrangement in a redundant circuit at a portion provided with a fuse an insulation film is simply disposed between the fuse and a semiconductor substrate to prevent blowing the fuse from affecting interconnections, semiconductor elements and the like otherwise arranged in a region immediately underlying the fuse and a region located in a vicinity thereof.

As a second such arrangement a blocking layer is disposed between a fuse and a semiconductor substrate to prevent blowing the fuse from affecting an underlying layer.

In particular, semiconductor devices corresponding to the second arrangement are proposed for example in Japanese Patent Laying-Open Nos. 11-345880, 2000-114382, 2000-68377, 10-242280, 10-294372, 2-25055, 63-3432 and 9-17877.

The above conventional semiconductor devices, however, have the following disadvantage: in recent years, there is an increasing demand for system large scale integrated circuits (LSIs) as semiconductor devices. For a system LSI a fuse overlies six or more layers for example.

A fuse overlying larger numbers of layers would have larger distances from a surface of the semiconductor substrate. Accordingly for the semiconductor device having the first arrangement a component of a laser beam radiated to blow the fuse that is transmitted through a layer underlying the fuse and reflected back by the surface of the semiconductor substrate would spread over a wide range remote from the location of the fuse.

As such, the reflected laser beam illuminates and negatively affects a semiconductor element, an interconnection and the like formed in a vicinity of the fuse.

Furthermore for the semiconductor device having the second arrangement the blocking layer disposed immediately under the fuse would regularly reflect the laser beam. As such, it is possible that a laser beam illuminating one of a plurality of fuses that is arranged at an end, and reflected by the blocking layer, may affect an interconnection, a semiconductor element or the like existing in a vicinity of the illuminated fuse.

Consequently, semiconductor elements, interconnections and the like cannot be arranged adjacent to a region having a fuse formed therein, which is an obstacle to reduction in size of semiconductor devices.

SUMMARY OF THE INVENTION

The present invention has been made to overcome the above disadvantage and it contemplates a semiconductor device reduced in size, preventing a laser beam blowing a fuse from affecting a vicinity of a region having the fuse formed therein.

The present invention in one aspect provides a semiconductor device including: a semiconductor substrate having a main surface; a fuse region formed on the main surface of the semiconductor substrate and provided with a plurality of fuses; and a blocking layer disposed between the fuse region and the semiconductor substrate to receive a laser beam radiated to blow the fuse and having arrived at the blocking layer, and reflect the laser beam to prevent the laser beam from travelling toward an underlying region, the blocking layer having a plane of reflection recessed downward to reflect the laser beam, the blocking layer being arranged to overlap substantially an entirety of the fuse region, as seen in a plane.

In the semiconductor device of the present invention in one aspect a blocking layer that has a plane of reflection recessed downward to reflect a laser beam can reduce light reflected by the plane of reflection that travels toward a region horizontally remote from the fuse region. Furthermore the blocking layer that is arranged to overlap substantially the entirety of the fuse region, as seen in a plane, can prevent transmission of a laser beam to reach a region immediately underlying the blocking layer. This allows interconnections, semiconductor elements and the like to be arranged for example adjacent to the fuse region and/or in the region immediately under the blocking layer to miniaturize the semiconductor device.

The present invention in another aspect provides a semiconductor device including: a semiconductor substrate having a main surface; a fuse formed on the main surface of the semiconductor substrate; and an antireflection layer having a surface with depressions and protrusions and underlying the fuse, to receive a laser beam radiated to blow the fuse and having arrived at the antireflection layer, and repeatedly reflect the laser beam between the adjacent protrusions to prevent upward reflection of the laser beam.

In the semiconductor device of the present invention in another aspect a laser beam diffracted and arriving at the antireflection layer having an uneven surface is reflected repeatedly between adjacent protrusions and depressions of the layer and meanwhile transmitted through or absorbed at a protrusion and eventually prevented from being reflected back upward. This can prevent the laser beam from being reflected toward a vicinity of a region having a fuse formed therein and accordingly allow interconnections, semiconductor elements and the like to be arranged adjacent to the fuse region to miniaturize the semiconductor device.

The foregoing and other objects, features, aspects and advantages of the present invention will become more apparent from the following detailed description of the present invention when taken in conjunction with the accompanying drawings.

DESCRIPTION OF THE PREFERRED
EMBODIMENTS

FIRST EMBODIMENT

Figure 1:
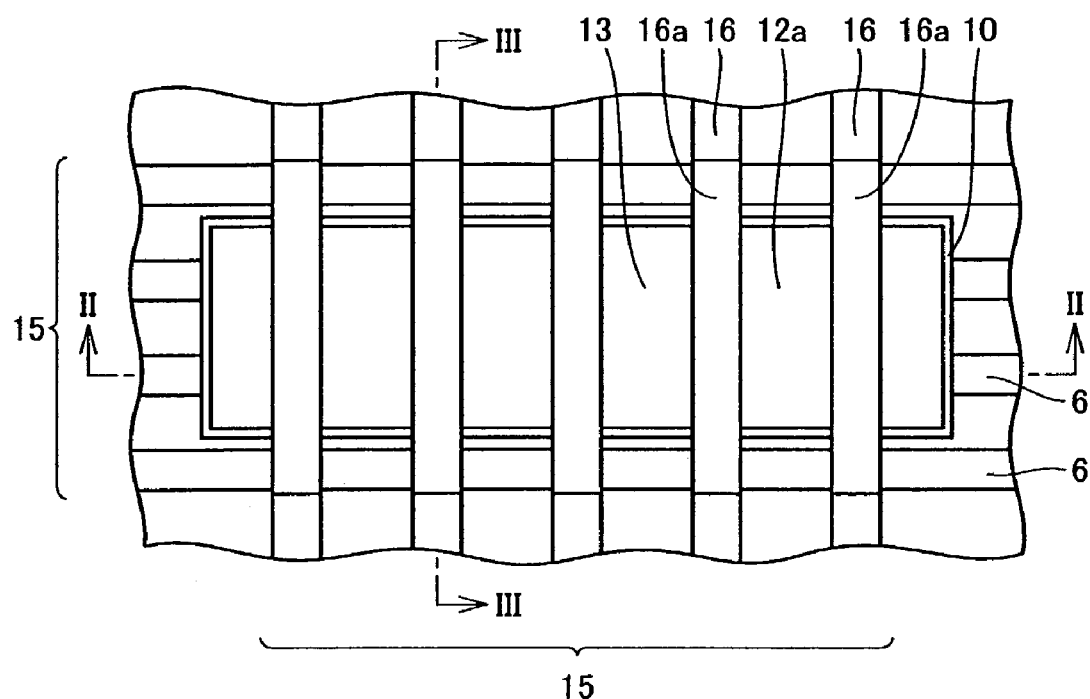
FIG. 1 is a plan view of a semiconductor device of the present invention in a first embodiment.
Figure 2:
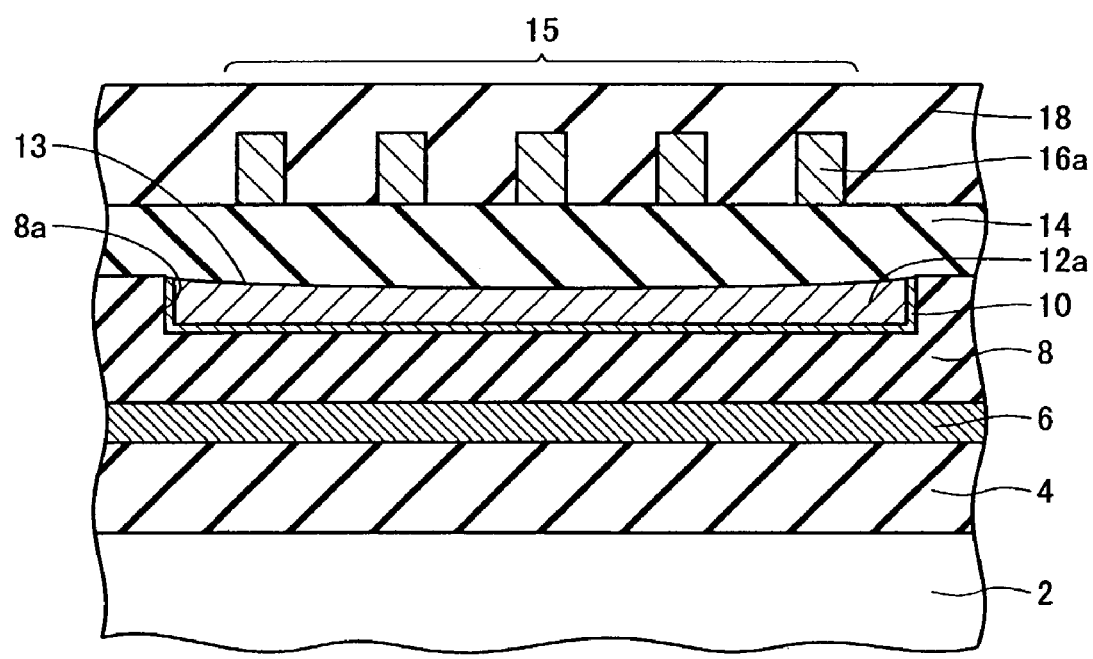
FIG. 2 is a cross section in the first embodiment, as taken along a line II—II shown in FIG. 1.
Figure 3:
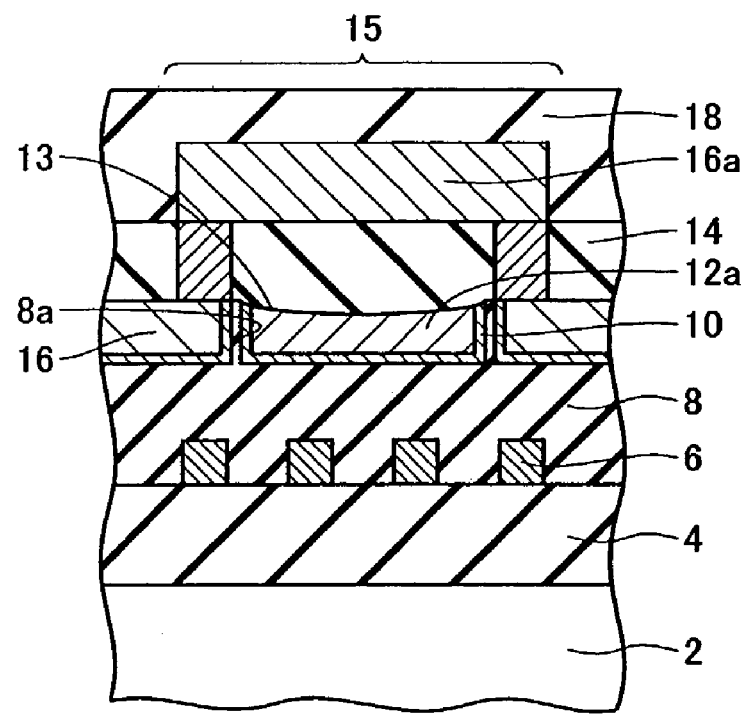
FIG. 3 is a cross section in the first embodiment, as taken along a line III—III shown in FIG. 1.

The present invention in a first embodiment provides a semiconductor device with a redundant circuit that includes a reflector layer of copper serving as a blocking layer preventing a laser beam from travelling, as described hereinafter. With reference to FIGS. 1–3, on a semiconductor substrate 2 a prescribed interconnection 6 is formed with a silicon oxide film 4 posed therebetween.

Interconnection 6 is further covered with a silicon oxide film 8 provided on silicon oxide film 4. Silicon oxide film 8 is provided with a recess 8a. In recess 8a a reflector layer of copper 12a is formed to serve as a blocking layer with a barrier metal 10 posed therebetween. The reflector layer of copper 12a is formed by damascene.

Furthermore on silicon oxide film 8 an interconnection 16 is formed to be connected to a fuse. If interconnection 16 is formed of copper, it would be formed by damascene. If it is formed for example of Al, AlCu or WSi then interconnection 16 would be formed conventionally.

The reflector layer of copper 12a and interconnection 16 are covered with a silicon oxide film 14 formed on silicon oxide film 8. On silicon oxide film 14 a region to have a fuse formed therein 15 is provided.

In fuse region 15 a plurality of fuses 16a connected to interconnection 16 are arranged. Fuses 16a are covered with a silicon oxide film 18 provided on silicon oxide film 14.

Figure 4:
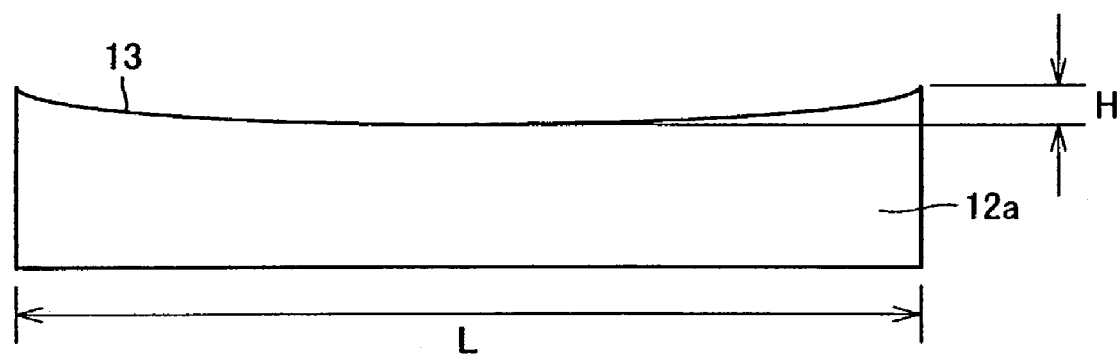
FIG. 4 is a view in cross section in the first embodiment showing a structure of a reflector layer of copper.

In the above described semiconductor device the reflector layer of copper 12a has a plane of reflection 13 recessed downward, as shown in FIG. 4, to reflect a laser beam. The recessed plane of reflection 13, as will be described hereinafter, is obtained through a dishing effect introduced in chemical mechanical polishing (CMP) to form the reflector layer of copper 12a.

Furthermore the reflector layer of copper 12a is arranged to overlap substantially the entirety of fuse region 15, as seen in a plane. In other words, the reflector layer of copper 12a and fuse region 15 overlap in a two dimensional layout, as shown in FIG. 1.

Figure 5:
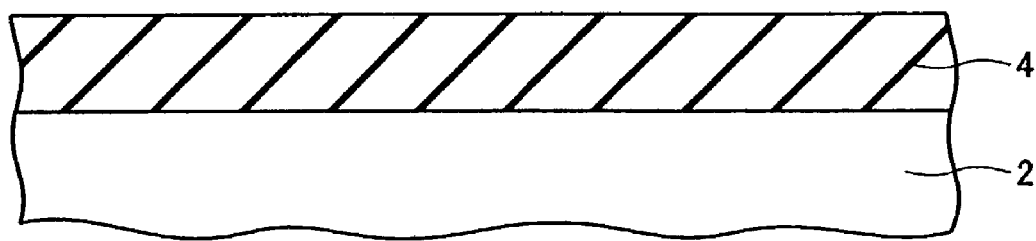
FIG. 5 shows in cross section a step of a method of fabricating the semiconductor device in the first embodiment.

One example of a method of fabricating the semiconductor device as described above will now be described. With reference to FIG. 5, initially on semiconductor substrate 2 chemical vapor deposition (CVD) is for example employed to provide silicon oxide film 4 and thereon a prescribed conductive layer (not shown) is formed to serve as an interconnection.

Figure 6:
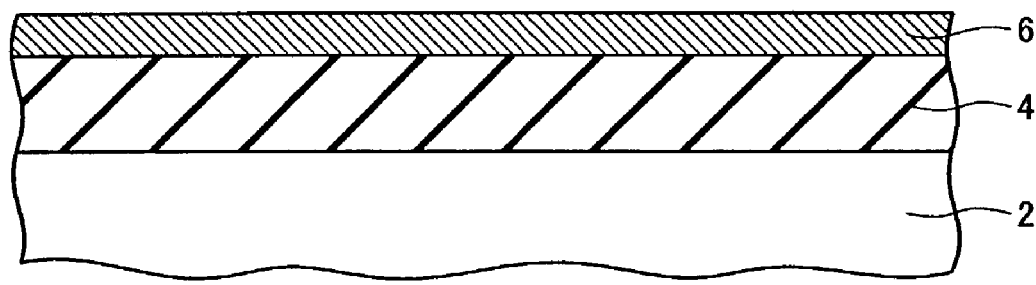
FIG. 6 shows in cross section a step performed in the first embodiment after the FIG. 5 step.
Figure 7:
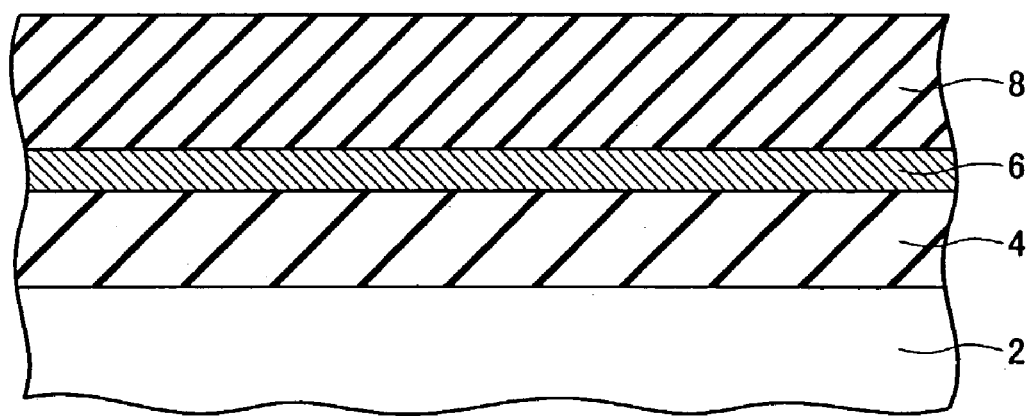
FIG. 7 shows in cross section a step performed in the first embodiment after the FIG. 6 step.

The conductive layer is subjected to photolithography and processed, as prescribed, to form interconnection 6, as shown in FIG. 6. Then with reference to FIG. 7 interconnection 6 is covered with silicon oxide film 8 for example formed by CVD. On silicon oxide film 8 a prescribed resist pattern (not shown) is formed.

Figure 8:
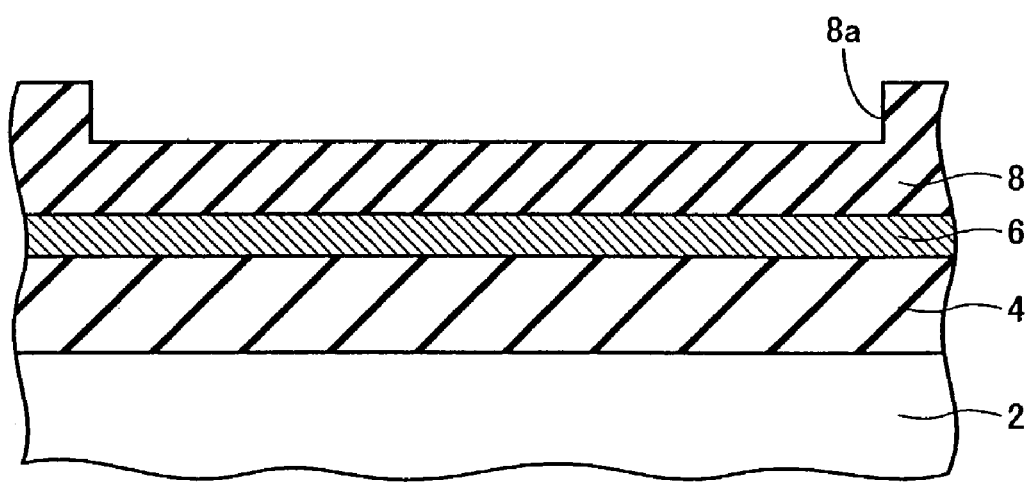
FIG. 8 shows in cross section a step performed in the first embodiment after the FIG. 7 step.

With the resist pattern used as a mask, silicon oxide film 8 is anisotropically etched to provide recess 8a, as shown in FIG. 8. Simultaneously, a recess for interconnection (not shown) is also formed for forming a prescribed interconnection.

Figure 9:
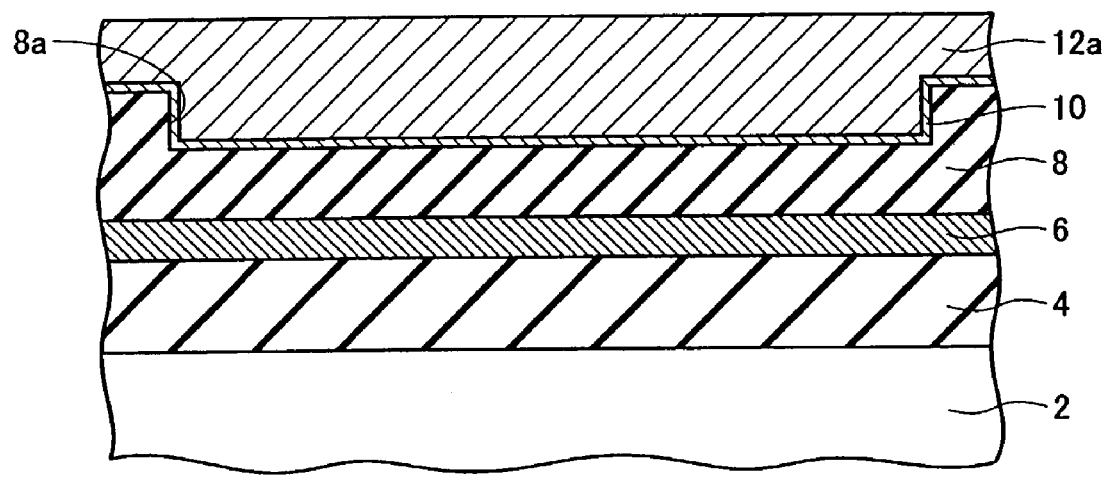
FIG. 9 shows in cross section a step performed in the first embodiment after the FIG. 8 step.

Then with reference to FIG. 9 a copper film 12 is provided on silicon oxide film 8 including recess 8a and the recess for interconnection, with a prescribed barrier metal 10 posed therebetween. Preferably, barrier metal 10 is a film formed of stacked layers for example of tantalum (Ta) and tantalum nitride (TaN).

Figure 10:
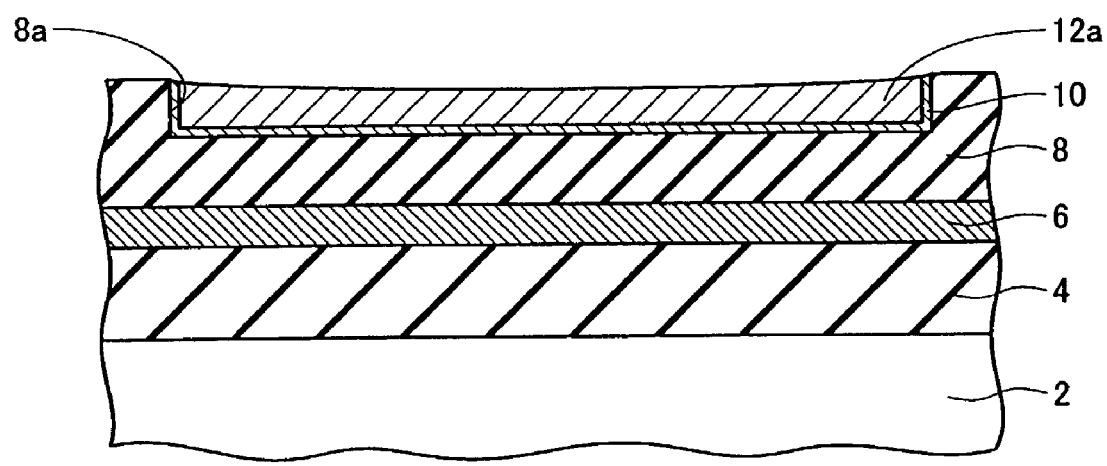
FIG. 10 shows in cross section a step performed in the first embodiment after the FIG. 9 step.

Then copper film 12 is chemically mechanically polished. Copper film 12 and barrier metal 10 that exist on an upper surface of silicon oxide film 8 are removed, while recess 8a and the recess for interconnection still have the copper film therein and in recess 8a the reflector layer of copper 12a is formed, as shown in FIG. 10. In the recess for interconnection, interconnection 16 is formed (see FIG. 3). Such a method of forming an interconnection and the reflector layer of copper 12a is referred to as a damascene method.

In this CMP process a dishing effect is particularly utilized to form the reflector layer of copper 12a. More specifically, a difference in material between exposed silicon oxide film 8 (an upper surface) and the copper film remaining in recess 8a and the size of the region of recess 8a contribute to copper film 12 having a surface polished further at a center than a periphery and thus recessed downward.

With reference to FIG. 4, for example if the reflector layer of copper 12a as seen longitudinally has a length L for example of approximately 10 μm then the periphery and the center have a difference in level H of approximately 50 nm to 100 nm. The reflector layer of copper 12a at a shorter side thereof (see FIG. 3) has a difference in level slightly smaller than longitudinal level difference H.

Figure 11:
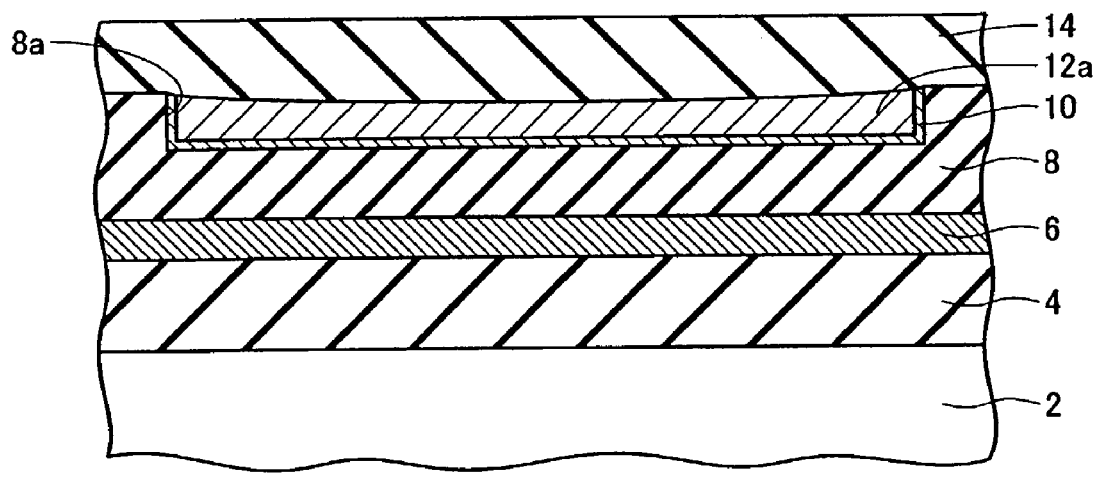
FIG. 11 shows in cross section a step performed in the first embodiment after the FIG. 10 step.

After the reflector layer of copper 12a is thus formed, the reflector layer of copper 12a and interconnection 16 are covered with silicon oxide film 14 for example formed by CVD on silicon oxide film 8, as shown in FIG. 11.

On silicon oxide film 14 a prescribed conductive layer (not shown) electrically connected to interconnection 16 and to serve as a fuse is formed. This conductive layer is used to form a plurality of fuses 16a.

Material that is used to form fuse 16a includes a material workable by etching, as represented for example by Al, AlCu, W and WSi, and a material difficult to process by etching, such as Cu.

Figure 12:
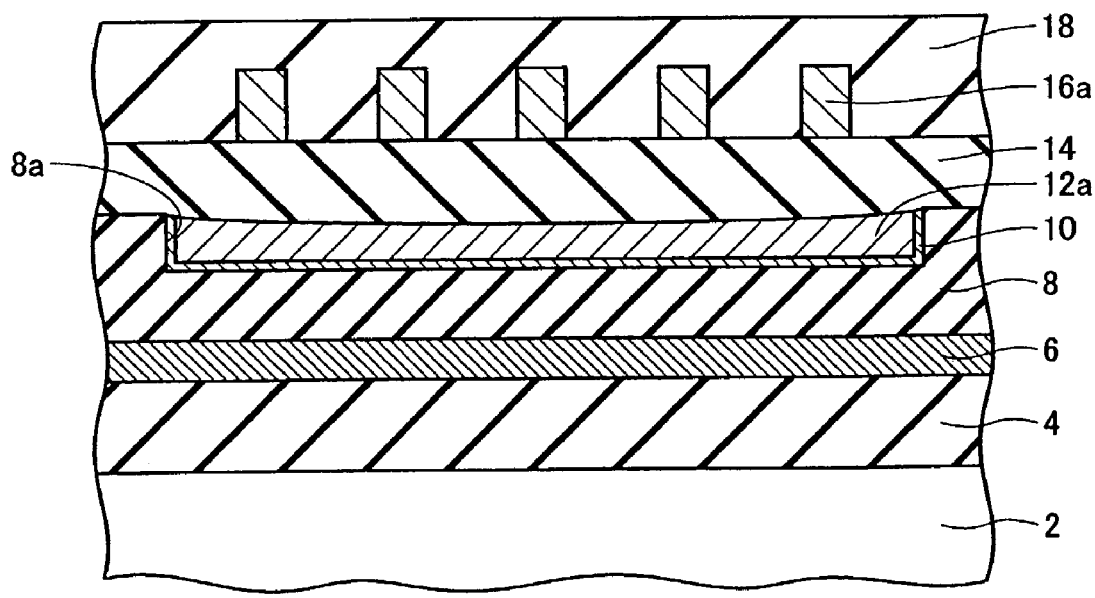
FIG. 12 shows in cross section a step performed in the first embodiment after the FIG. 11 step.

If material that can be etched is used to form fuse 16a, forming the prescribed conductive layer serving as the fuse is followed by forming a prescribed resist pattern (not shown) on the conductive layer. With the resist pattern used as a mask, the conductive layer is anisotropically etched to form the plurality of fuses 16a, as shown in FIG. 12.

If Cu or material difficult to process by etching is used to form fuse 16a, damascene is employed to form the plurality of fuses 16a, as is when the reflector layer of copper 12a is formed.

After the plurality of fuses 16a are formed, they are covered with silicon oxide film 18 deposited on silicon oxide film 14 for example by CVD.

A semiconductor device including fuses thus completes. In the series of steps producing the semiconductor device, memory cells (not shown) for storing information are also formed in parallel. Of the formed memory cells a memory cell determined as being defective is substituted with a defectless memory cell by laser trimming. In doing so, a prescribed fuse would be blown.

Hereinafter will be described an optical path of a laser beam that has illuminated the most rightward one of a plurality of fuses formed in a fuse region, as shown in FIG. 2.

Figure 13:
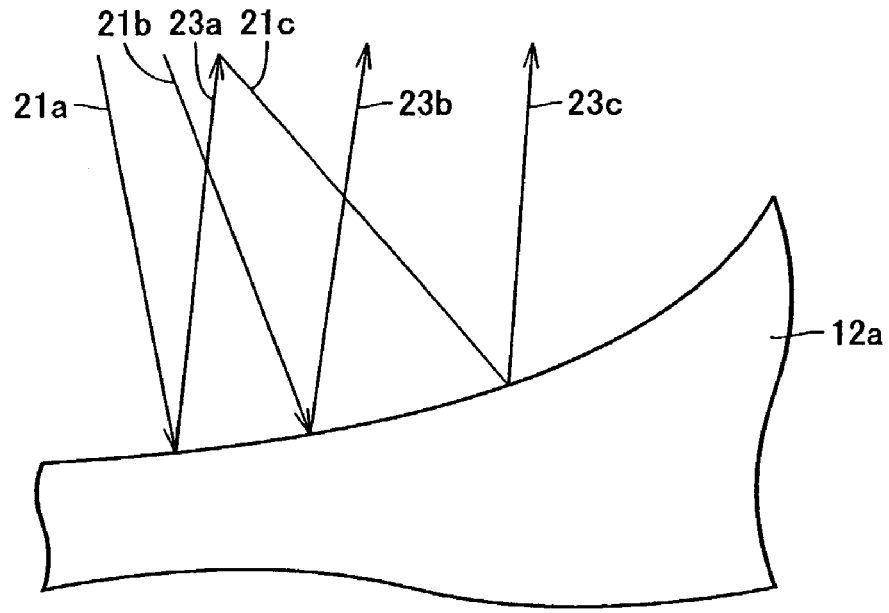
FIG. 13 is a partially enlarged view in cross section in the first embodiment showing how the reflector layer of copper reflects a laser beam.

As shown in FIG. 13, laser beams 21a, 21b, 21c diffracted by the most rightward fuse are incident on the reflector layer of copper 12a and reflected thereby at a surface thereof upward.

Figure 14:
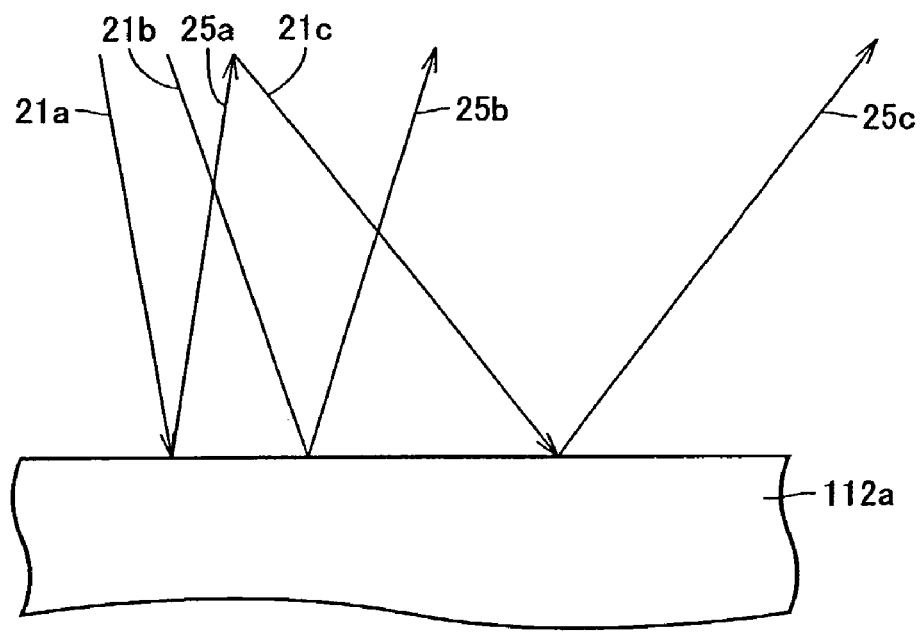
FIG. 14 is a partially enlarged view in cross section in the first embodiment showing for comparison how a reflector layer of copper reflects a laser beam.

Reflections of light 23a–23c from the recessed surface have their respective horizontal components (i.e., components in a direction parallel to a main surface of the semiconductor substrate) smaller than reflections of light 25a–25c from a flat surface of a reflector layer of copper 112a in the conventional semiconductor device shown in FIG. 14.

As such, reflections of light 23a–23c has a smaller component than reflections of light 25a–25c that travels toward a region horizontally remote from the fuse region. This also applies to the most leftward fuse in FIG. 2.

This allows interconnections, semiconductor elements and the like to be arranged adjacent to the fuse region. The semiconductor device can thus be reduced in size.

While the reflector layer of copper 12a reflects a laser beam, it also absorbs some components. Hereinafter, laser beam absorptance of the reflector layer of copper 12a will be described.

Figure 15:
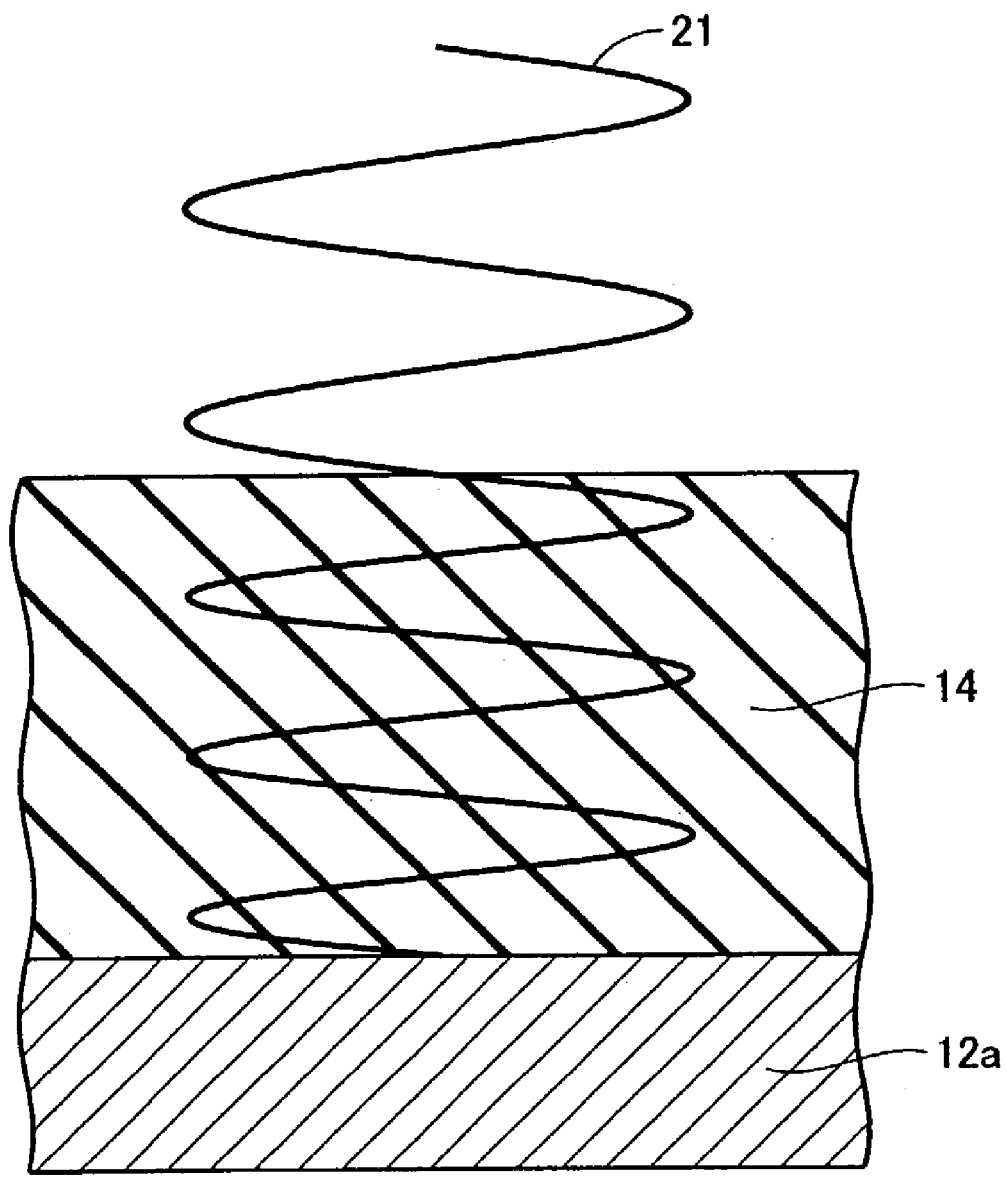
FIG. 15 is a partially enlarged view in cross section for illustrating an effect of the reflector layer of copper in the first embodiment.

With reference to FIG. 15 a laser beam 21 diffracted by a fuse and transmitted through silicon oxide film 14 is incident on the reflector layer of copper 12a. Note that in FIG. 15 a manner of incidence of a laser beam having a prescribed wavelength is conceptually represented.

Generally, the absorptance of a laser beam incident on a surface of a material of metal periodically varies, as depending on the thickness of a silicon oxide film existing on the surface of the material of metal. Note that absorptance refers to a component (a ratio) corresponding to the intensity of an incident laser beam, as represented by a value of 100, minus reflected and transmitted component. Also note that the laser beam's wavelength was set to be 1.047 μm and its intensity (or energy) was set to be 0.5 μJ.

Figure 16:
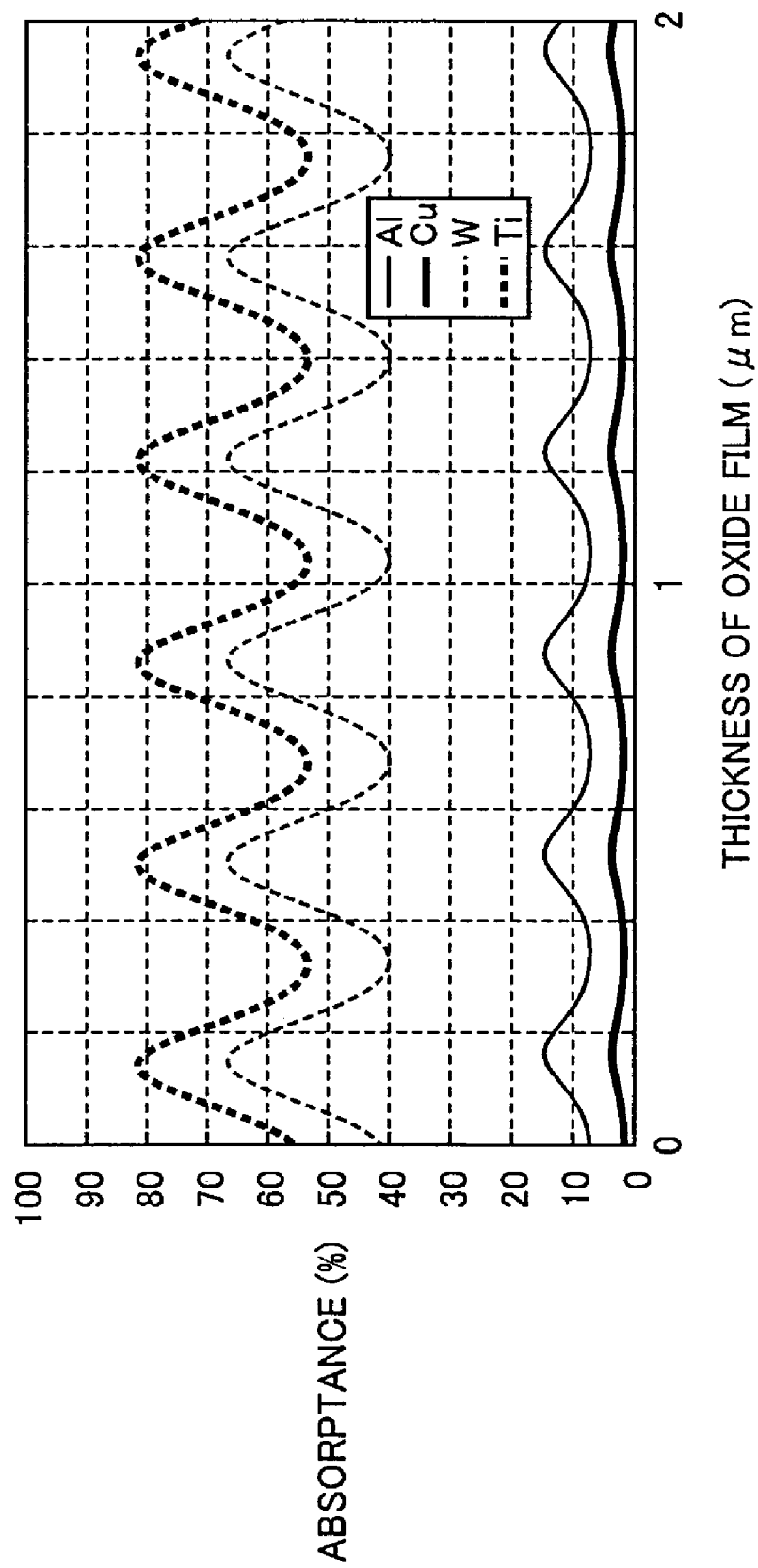
FIG. 16 represents a relationship between thickness of silicon oxide film and absorptance for different types of metal at their surfaces for illustrating an effect of the reflector layer of copper in the first embodiment.

FIG. 16 represents a relationship between thickness of silicon oxide film and absorptance for different types of material of metal at their surfaces. In FIG. 16 the vertical axis represents absorptance and the horizontal axis represents the thickness of the silicon oxide film. As the different types of material of metal are used aluminum (Al), copper (Cu), tungsten (W) and titanium (Ti).

Note that in this case the absorptance of the material of metal is calculated from the thickness of the silicon oxide film.

As shown in FIG. 16, the absorptance corresponding to each material of metal periodically varies as depending on the thickness of the silicon oxide film. It can be seen that of the four types of material of metal, titanium provides the highest laser beam absorptance and copper provides the lowest absorptance.

As such, the reflector layer of copper 12a provides a lower absorptance than a material such as aluminum forming a fuse. This can prevent the reflector layer of copper 12a from having otherwise further increased temperature.

Figure 17:
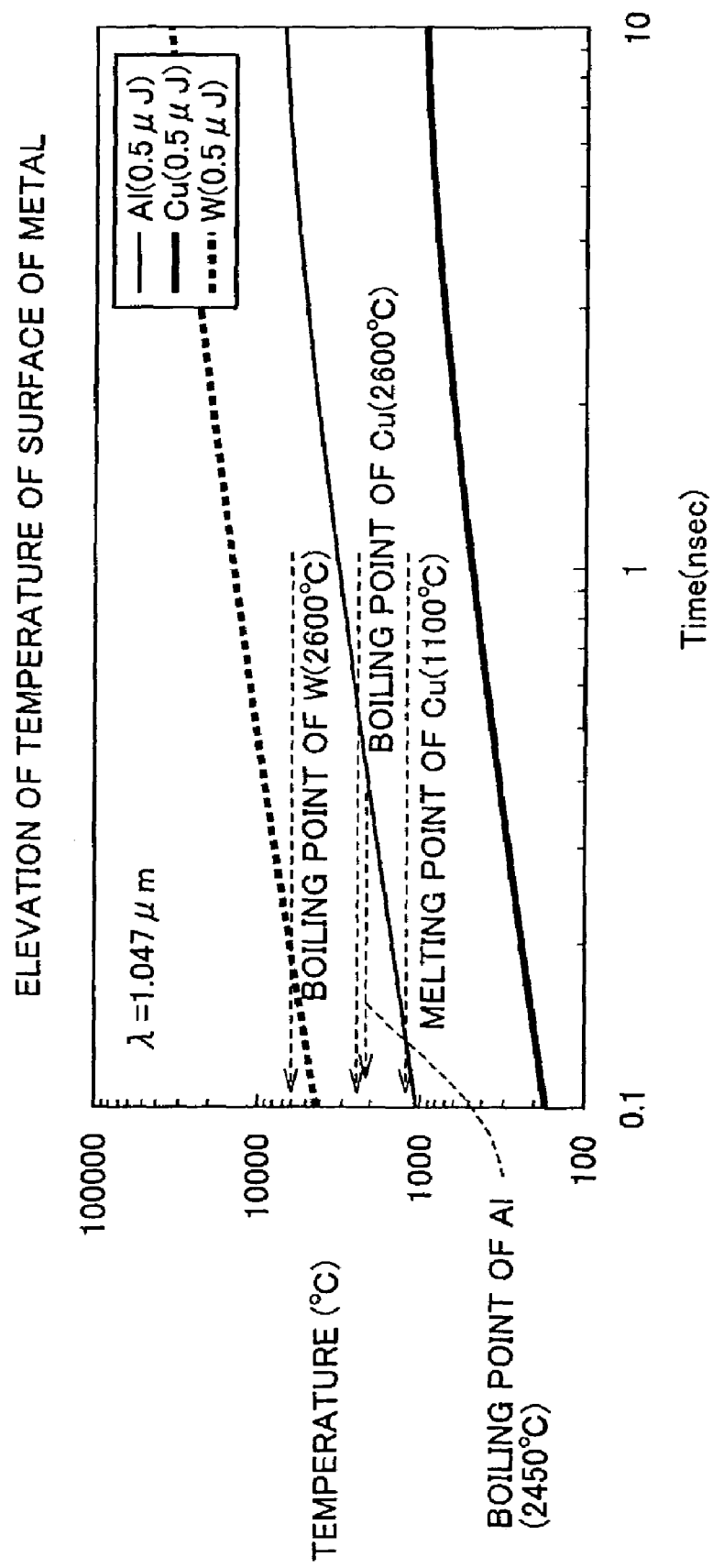
FIG. 17 represents a relationship between laser beam radiation time and temperature for different types of metal at their surfaces for illustrating an effect of the reflector layer of copper in the first embodiment.

Furthermore FIG. 17 shows a relationship between the time taken to illuminate materials of metal with a laser beam and the elevation in temperature of the materials at their surfaces. In FIG. 17 the vertical axis represents temperature and the horizontal axis represents the laser beam radiation time. Also note that the laser beam's wavelength was set to be 1.047 μm and its intensity (energy) was set to be 0.5 μJ. Furthermore, the temperature elevation was represented by the following function:

$$\Delta T(z, t) = \frac{2H}{K}\sqrt{\kappa t}\left[ierfc\left(\frac{z}{2\sqrt{\kappa t}}\right) - ierfc\left(\frac{\sqrt{z^2 + w^2/2}}{2\sqrt{\kappa t}}\right)\right]$$

wherein H represents power (W/m$^2$) supplied per unit area, K represents thermal conductivity (W/m·° C.), κ represents thermal diffusivity (m$^2$/s), w represents a beam diameter (m), and z represents a vertical distance from a surface of metal. At a surface of metal, z=0. For the power, a maximal value of laser beam absorptance for the metals indicated in FIG. 16 is considered.

Furthermore, ierfc (x) is a function represented by the following expression:

$$ierfc(x) = \int_{x}^{\infty} erfc(t)dt$$

wherein erfc (x) is a complimentary error function.

It can be understood from FIG. 17 that aluminum and tungsten illuminated with a laser beam have their respective surface temperatures reaching their respective boiling points in relatively short periods of time (up to 0.2 nsec).

In contrast, it can also be understood that there is a sufficient, longer period of time (of 10 nsec) before copper has a surface temperature reaching its melting point than aluminum and tungsten and that there is a further sufficient, longer period of time before copper has a surface temperature reaching its boiling point than aluminum and tungsten.

It can thus be understood that in the present semiconductor device the reflector layer of copper 12a is not readily melted by a laser beam incident thereon.

The reflector layer of copper 12a is formed in a region having a size, as described hereinafter. As shown in FIGS. 9 and 10, the reflector layer of copper 12a overlies recess 8a of silicon oxide film 8 with barrier metal 10 posed therebetween.

This allows the reflector layer of copper 12a to have bottom and side surfaces covered with barrier metal 10. In particular, when barrier metal 10 exposed at a surface is illuminated with a laser beam, barrier metal 10 is heated and it melts and vaporizes.

When barrier metal 10 is vaporized, the exact reflector layer of copper 12a would be damaged. Accordingly, the reflector layer of copper 12a desirably has a sufficiently large size to prevent a laser beam from being incident on exposed barrier metal 10 and as shown in FIG. 1, as seen in a two dimensional layout, the reflector layer of copper 12a is desirably arranged to overlap at least substantially the entirety of fuse region 15.

Furthermore, forming the reflector layer of copper to have a size overlapping substantially the entirety of fuse region 15, rather than providing a barrier metal and a reflector layer of copper immediately under each individual one of a plurality of fuses, prevents a diffracted laser beam from being readily incident on a barrier metal exposed at a surface. This can reduce damage to the exact reflector layer of copper.

Figure 18:
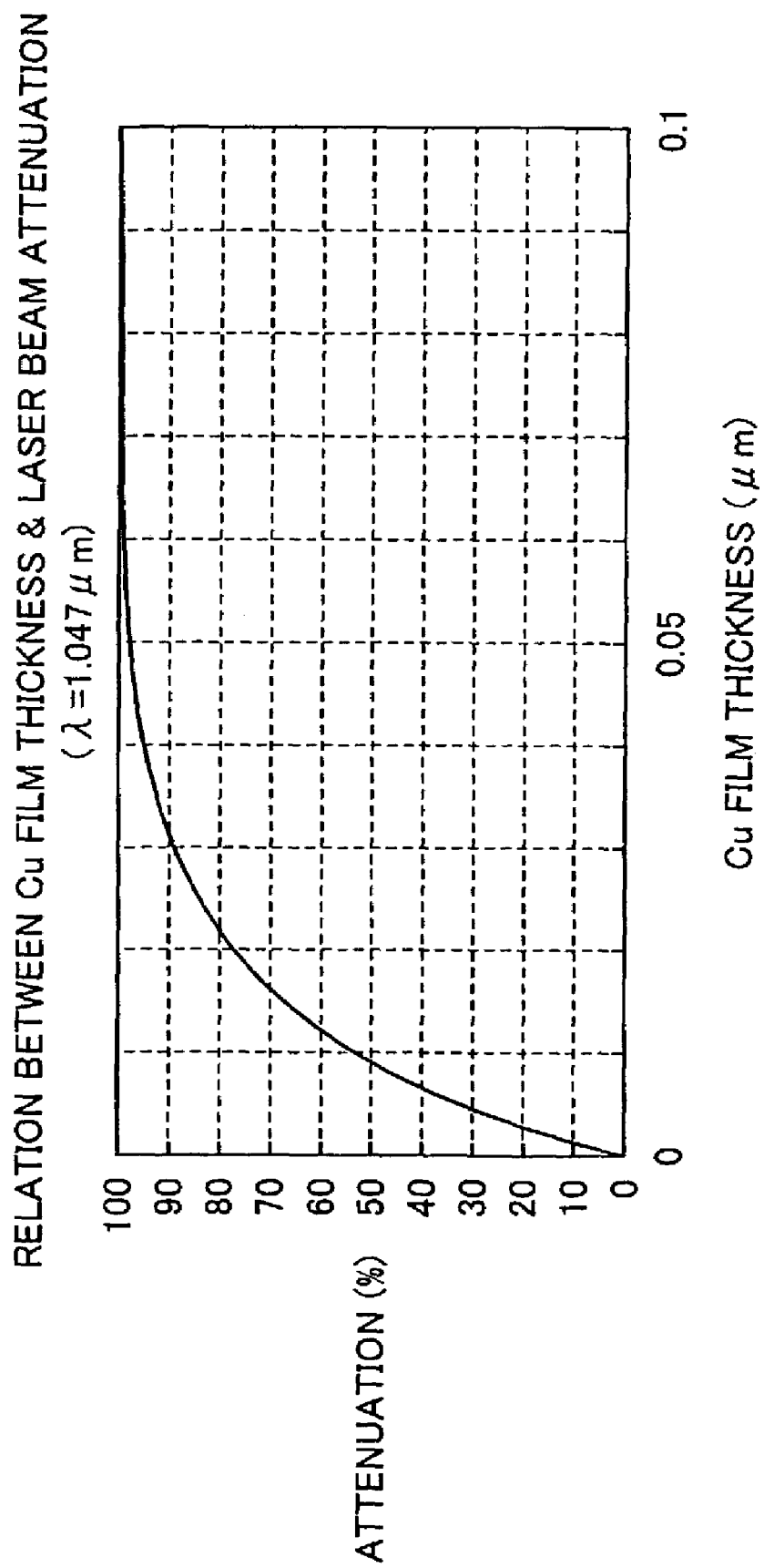
FIG. 18 represents a relationship between the thickness of the reflector layer of copper and laser beam attenuation for illustrating an effect of the reflector layer of copper.

The reflector layer of copper 12a has a thickness, as will be described hereinafter. In general, transmission through a metal of a laser beam incident on a surface of the metal depends on the thickness of the metal. FIG. 18 is a graph of attenuation of energy of an incident laser beam for the reflector layer of copper 12a, represented as a function of a depth from a surface of the layer. The laser beam has a wavelength of 1.047 μm.

To permit the reflector layer of copper 12a to protect underlying interconnections, semiconductor elements and the like from a laser beam applied in laser-trimming the laser beam's energy needs to be attenuated by no less than approximately 99%.

It can be understood from FIG. 18 that the laser beam's energy can be attenuated by no less than 99% simply by setting the thickness of the reflector layer of copper 12a to be at least 60 nm. Thus interconnections, semiconductor elements and the like can be arranged in a region immediately underlying the reflector layer of copper.

In the above described semiconductor device the reflector layer of copper 12a having a plane of reflection recessed downward reduces reflections of light 23a–23c that travel toward a region horizontally remote from a region having a fuse arranged therein. Furthermore the reflector layer of copper also prevents a laser beam from transmitting therethrough to reach a region existing immediately under the layer.

As such, interconnections, semiconductor elements and the like can be arranged adjacent to a fuse and/or in a region existing immediately under the reflector layer of copper to provide increased degrees of freedom in layout and also allow the semiconductor device to be reduced in size.

SECOND EMBODIMENT

Figure 19:
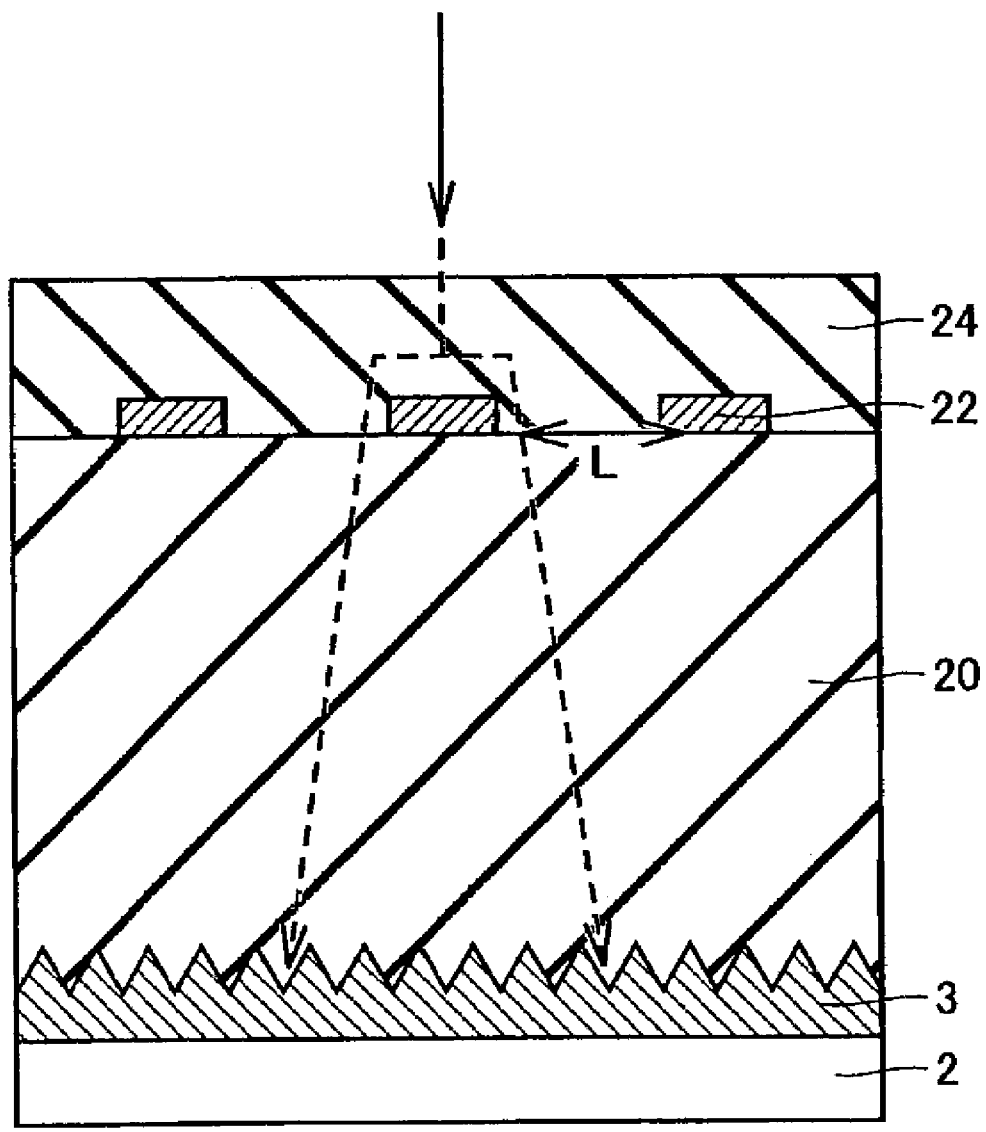
FIG. 19 is a cross section of the semiconductor device of the present invention in a second embodiment.

The present invention in a second embodiment provides a semiconductor device including an antireflection layer preventing reflection of a laser beam, as will be described hereinafter. With reference to FIG. 19, semiconductor substrate 2 has a surface with an antireflection layer 3 formed thereon.

Antireflection layer 3 is covered with a silicon oxide film 20. On silicon oxide film 20 a prescribed fuse 22 is formed. Fuse 22 is covered with a silicon oxide film 24 provided on silicon oxide film 20.

Antireflection layer 3 may be the exact semiconductor substrate 2 or it may be a layer formed on a surface of semiconductor substrate 2.

Figure 20:
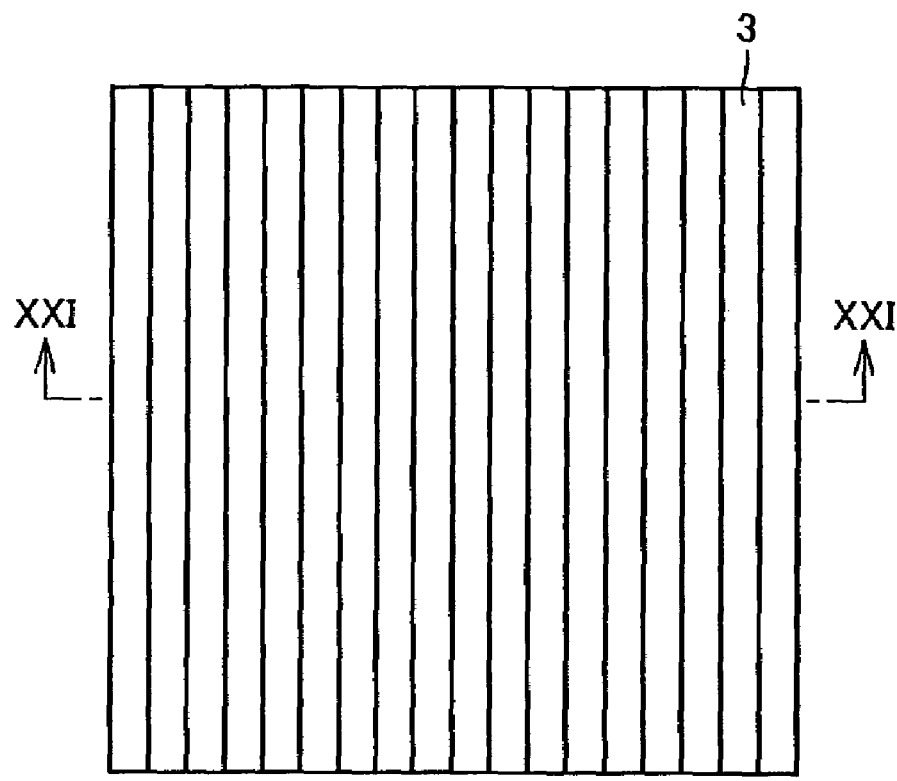
FIG. 20 is a plan view of an exemplary structure of an antireflection layer in the second embodiment.
Figure 21:
FIG. 21 is a view in cross section in the second embodiment, as taken along a line XXI—XXI of FIG. 20.
Figure 22:
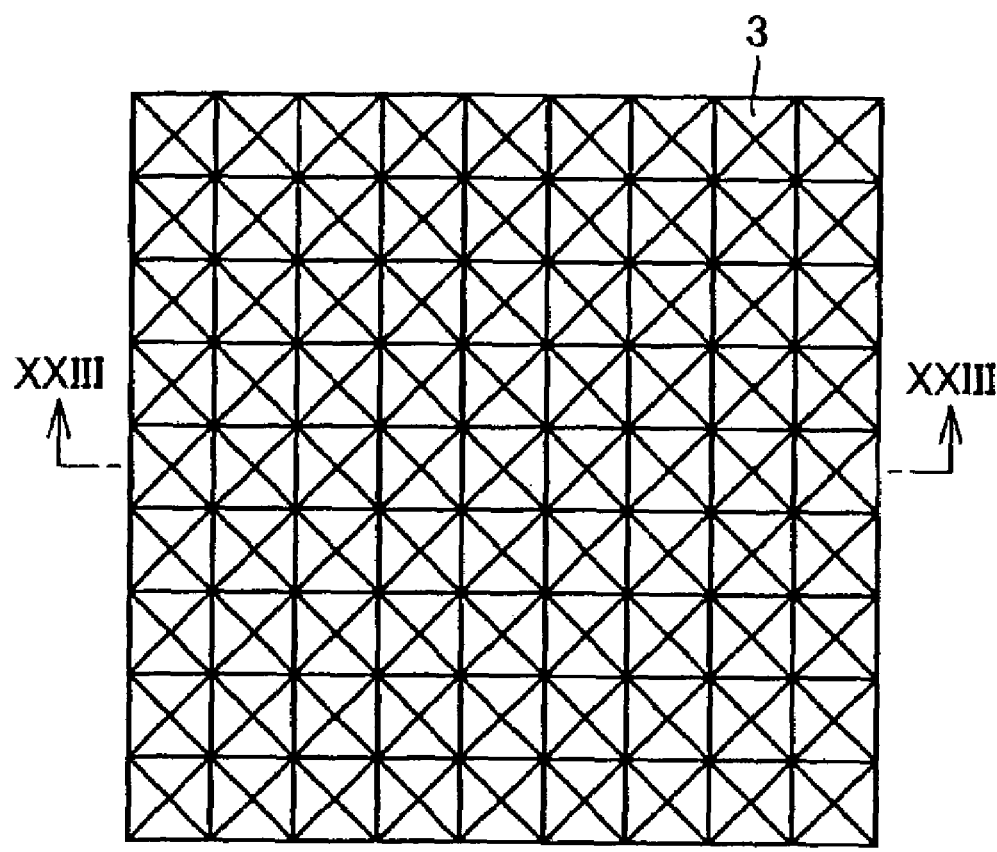
FIG. 22 is a plan view showing another exemplary configuration of the antireflection layer in the second embodiment.
Figure 23:
FIG. 23 is a view in cross section in the second embodiment, as taken along a line XXIII—XXIII of FIG. 22.

A laser beam is incident on antireflection layer 3 at an upper surface having depressions and protrusions formed to extend in one direction, for example as shown in FIGS. 20 and 21. Alternatively, antireflection layer 3 may have an upper surface having protrusions in a matrix, as shown in FIGS. 22 and 23.

Figure 24:
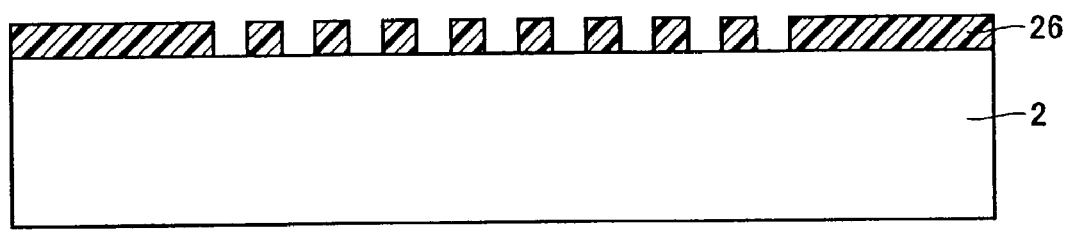
FIG. 24 shows in cross section a step of a method of fabricating a semiconductor device in the second embodiment.
Figure 25:
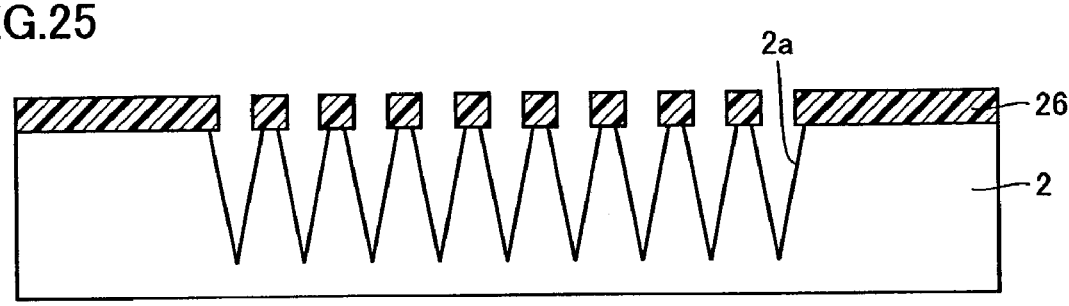
FIG. 25 shows in cross section a step in the second embodiment subsequent to the FIG. 23 step.
Figure 26:
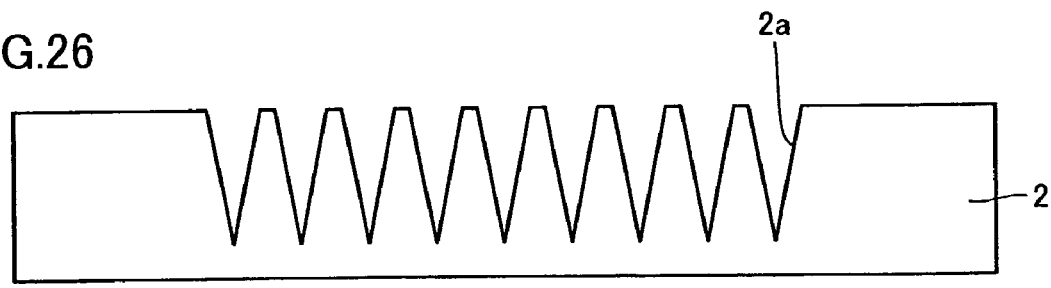
FIG. 26 shows in cross section a step in the second embodiment subsequent to the FIG. 24 step.

An example of a method of forming such an antireflection layer will now be described. Initially, as shown in FIG. 24, on semiconductor substrate 2 a prescribed resist pattern 26 is formed. Then, as shown in FIG. 25, with resist pattern 26 used as a mask, exposed semiconductor substrate (silicon) 2 is anisotropically etched to form a depression 2a. Subsequently, as shown in FIG. 26, resist pattern 26 is removed.

After resist pattern 26 is removed, silicon oxide film 20 is formed on antireflection layer 3, as shown in FIG. 19, and a prescribed interconnection including fuse 22 is formed on silicon oxide film 20. Fuse 22 is covered with silicon oxide film 24. A semiconductor device thus completes.

Figure 27:
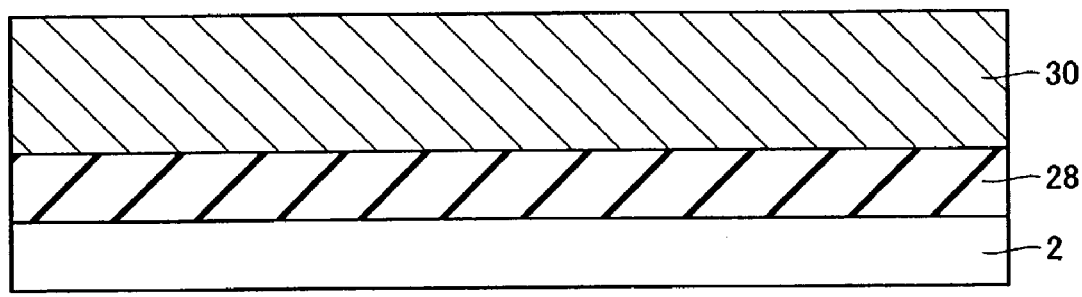
FIG. 27 shows in cross section a step of another method of fabricating the semiconductor device in the second embodiment.

Another example of the method of forming the antireflection layer will then be described. Initially, as shown in FIG. 27, on semiconductor substrate 2 a silicon oxide film 28 is formed and thereon for example CVD or sputtering is employed to form an amorphous silicon layer 30.

Figure 28:
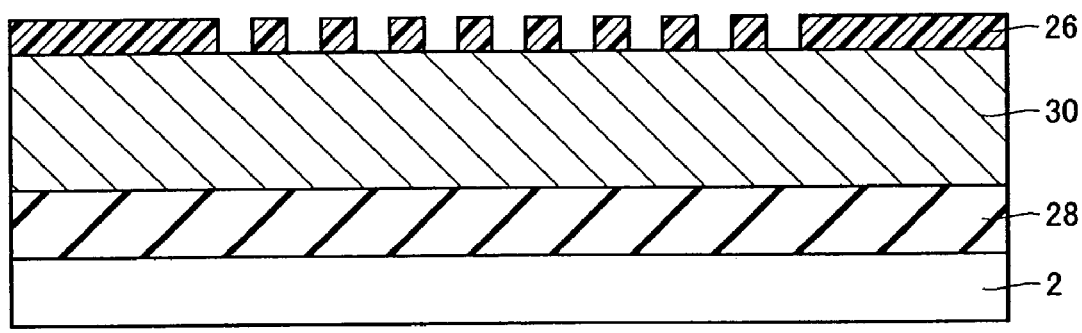
FIG. 28 shows in cross section a step in the second embodiment subsequent to the FIG. 26 step.
Figure 29:
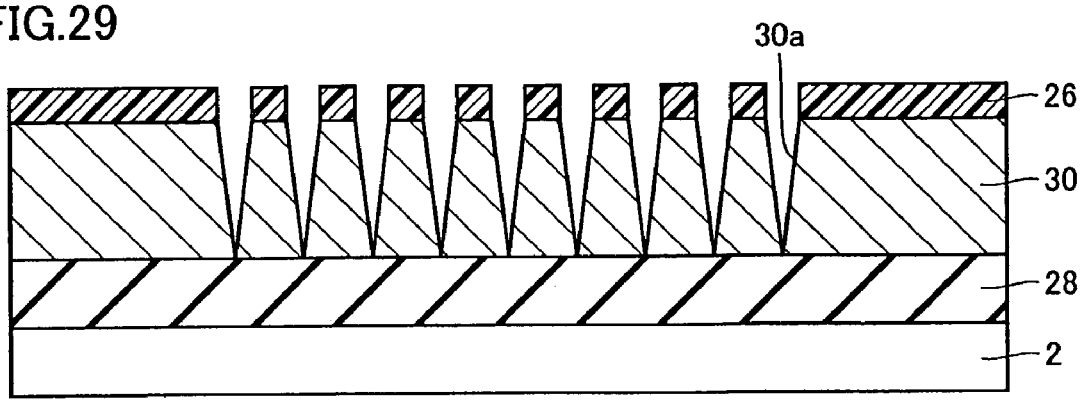
FIG. 29 shows in cross section a step in the second embodiment subsequent to the FIG. 27 step.
Figure 30:
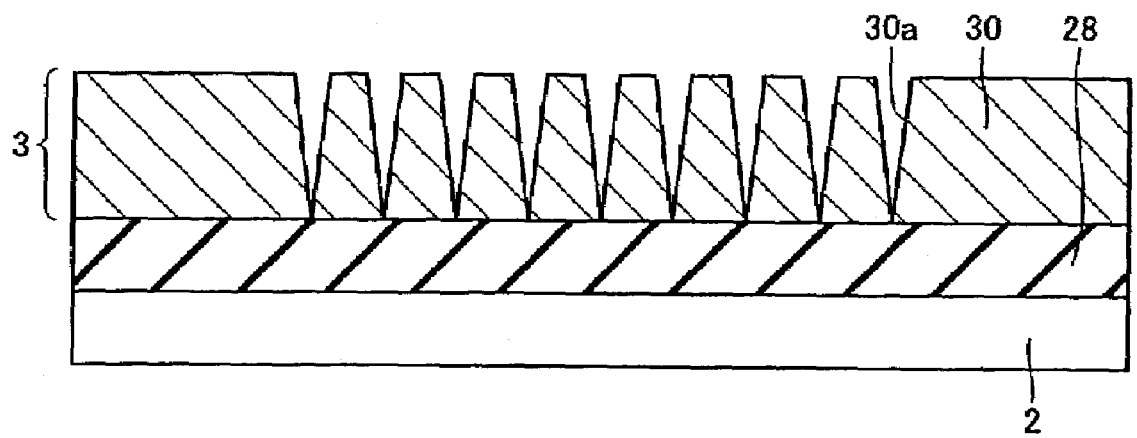
FIG. 30 shows in cross section a step in the second embodiment subsequent to the FIG. 28 step.

Then, as shown in FIG. 28, on amorphous silicon layer 30 a prescribed resist pattern 26 is formed. Then, as shown in FIG. 29, with resist pattern 26 used as a mask, exposed amorphous silicon 30 is anisotropically etched to form a depression 30a. Subsequently, as shown in FIG. 30, resist pattern 26 is removed.

After resist pattern 26 is removed, the aforementioned method is similarly used to form a silicon oxide film, a prescribed interconnection including a fuse, and the like to complete a semiconductor substrate.

Antireflection layer 3 will more specifically be described in structure. If protrusions are formed with a period shorter than the wavelength of an incident laser beam, no diffracted light (diffracted wave) attributed to the incident laser beam is not generated. As such, the portions provided with the protrusions is the same in property as a medium having an average index of refraction with respect to the incident laser beam.

Figure 31:
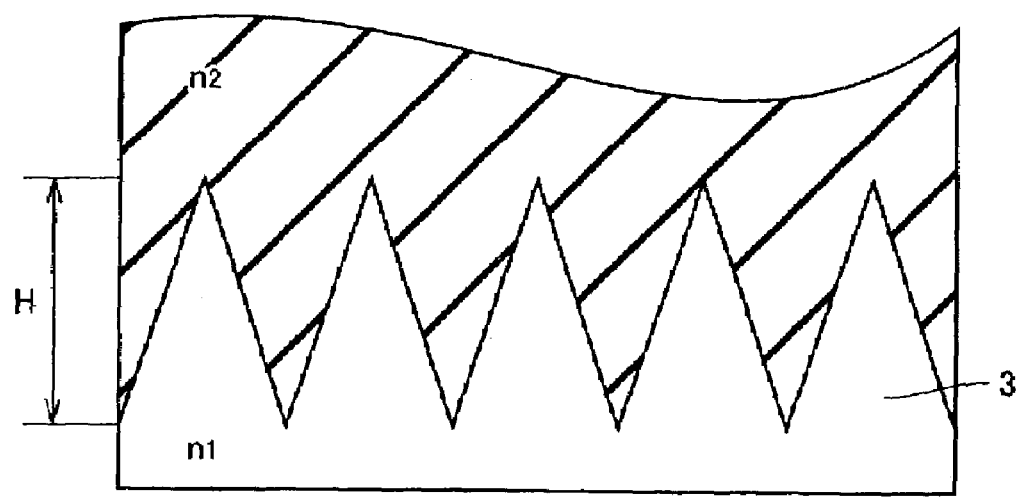
FIG. 31 is a partially enlarged cross section in the second embodiment for illustrating an effect of the antireflection layer.
Figure 32:
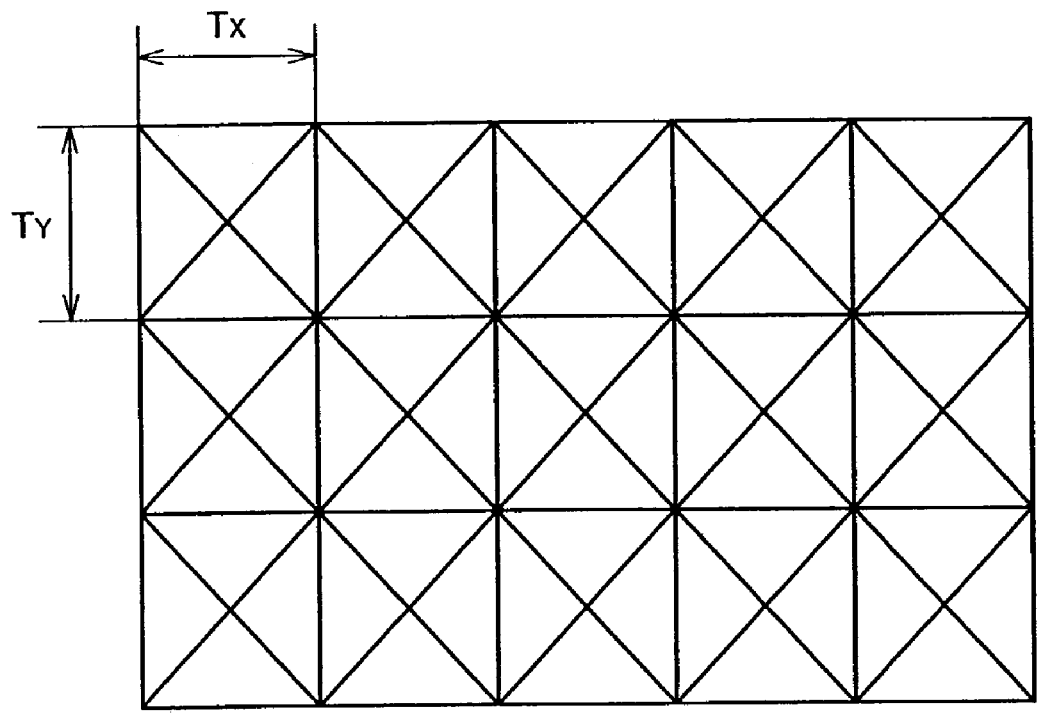
FIG. 32 is a top view in the second embodiment for illustrating an effect of the antireflection layer.
Figure 33:
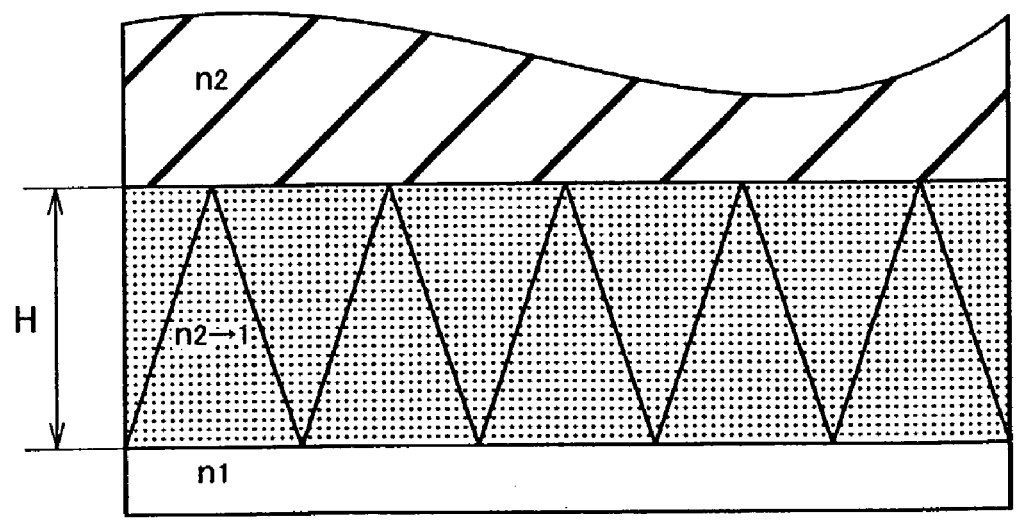
FIG. 33 represents a variation in index of reflection for illustrating an effect of the antireflection layer in the second embodiment.

For example if in antireflection layer 3 having protrusions in matrix as shown in FIGS. 31 and 32 the protrusions have periods Tx and Ty in directions x and y, respectively, a height H, and provide an index of refraction $n_1$ and a periphery provides an index of refraction $n_2$ then with reference to FIG. 33 antireflection layer 3 provides an index of refraction $n_2 \rightarrow_1$ varying from the index of refraction $n_2$ to the index of refraction $n_1$ continuously gradually.

In general, reflection of a laser beam and other similar light would be caused by an abrupt variation of an index of refraction. As shown in FIG. 33, as an index of refraction continuously gradually varies, a laser beam would hardly be reflected upward.

antireflection layer 3 having a gently varying index of refraction provides an effectively reduced reflection of a laser beam incident thereon. To achieve this, the protrusion is desirably formed to have an aspect ratio (H/Tx or H/Ty) of no less than two.

Figure 34:
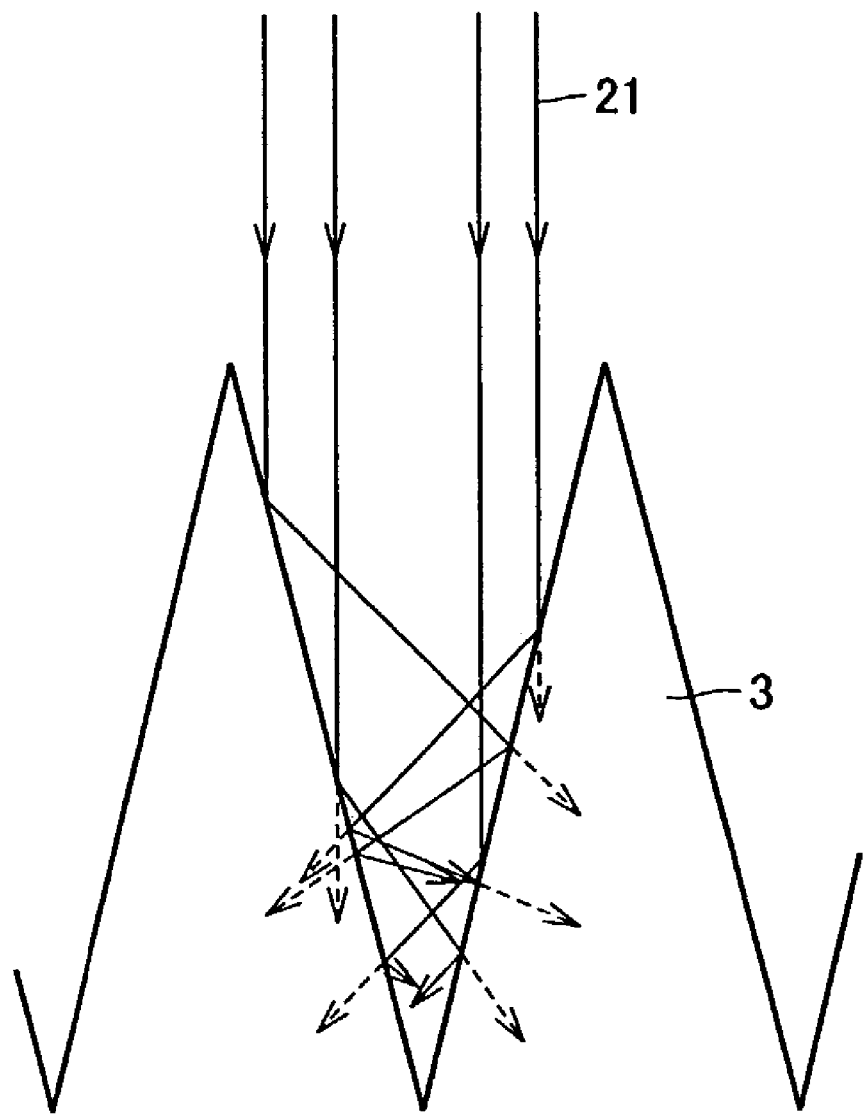
FIG. 34 shows one example of an optical path of a laser beam incident on the antireflection layer in the second embodiment.

As such, a laser beam diffracted by a fuse and arriving at antireflection layer 3 is reflected by the layer repeatedly between adjacent protrusions and meanwhile transmitted through or absorbed by the protrusions and as a result less reflected upward, as shown in FIG. 34.

This can prevent a laser beam from being reflected back toward a vicinity of the fuse region, which allows interconnections, semiconductor elements and the like to be arranged adjacent to the fuse region.

While in the above a antireflection layer having protrusions formed in a matrix has been described by way of example, an antireflection layer having protrusions arranged to extend in one direction that are formed in conformity with the antireflection layer having protrusions arranged in the matrix can also reduce reflection of a laser beam incident thereon.

As such, if a laser beam diffracted by a fuse travels toward semiconductor substrate 2, it can be incident on and prevented by antireflection layer 3 from being reflected upward.

Thus interconnections, semiconductor elements and the like formed in a vicinity of the fuse region can no longer be illuminated by the laser beam or affected thereby.

In particular in semiconductor devices adopting a multi-layer interconnection configuration such as system LSI a layer having fuses have a relatively large distance from a surface of a semiconductor substrate. Accordingly, a laser beam that is reflected in such a semiconductor device in a vicinity of the surface of the semiconductor substrate would reach a region remoter from the region having a fuse to be blown than a laser beam reflected in other types of semiconductor devices.

Furthermore it is also necessary to increase an interval L between adjacent fuses (see FIG. 19) to prevent a laser beam diffracted by a particular fuse and reflected from affecting a fuse adjacent to the particular fuse.

Forming the above described antireflection layer for the semiconductor device having such a multi-layered interconnection configuration can prevent reflection of a laser beam diffracted by a fuse and having arrived. This allows connections, semiconductor elements and the like to be arranged adjacent to the region having fuses. Interval L can also be reduced.

An exemplary variation of the antireflection layer will now be described. For the above described semiconductor device, as an antireflection layer a recess is intentionally formed and as a result a protrusion is formed, by way of example, as has been described above.

Figure 35:
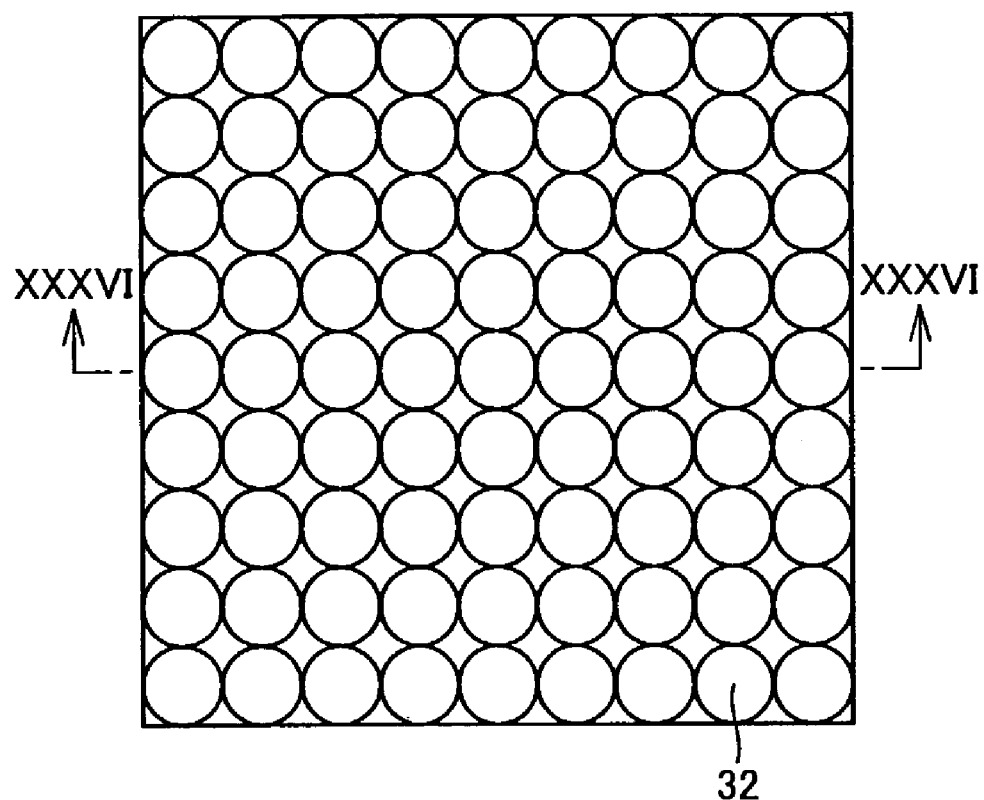
FIG. 35 is a plan view of an exemplary variation of the structure of the antireflection layer in the second embodiment.
Figure 36:
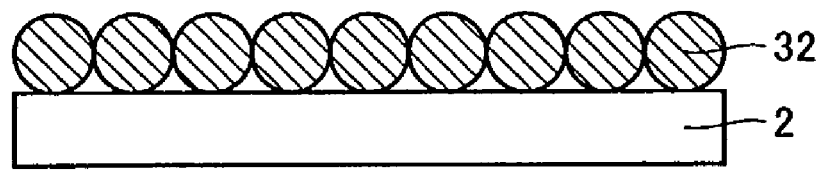
FIG. 36 is a view in cross section in the second embodiment, as taken along a line XXXVI—XXXVI of FIG. 35.

Hereinafter, a protrusion is by way of example intentionally formed, as will be described hereinafter. For example, as shown in FIGS. 35 and 36, an antireflection layer has a surface with a protrusion intentionally formed. This protrusion may be formed directly on a surface of semiconductor substrate 2 or in a prescribed layer formed on a surface of semiconductor layer 2.

Figure 37:
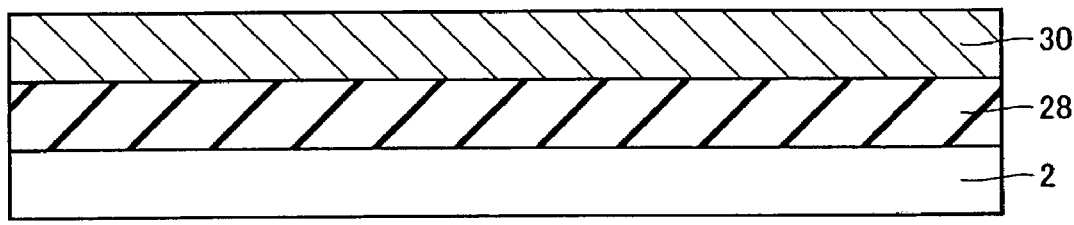
FIG. 37 is a view in cross section showing a step of a method of fabricating the semiconductor device in the second embodiment in an exemplary variation.

The protrusion is formed by a method, by way of example, as will be described hereinafter. Initially, as shown in FIG. 37, on semiconductor substrate 2 silicon oxide film 28 is formed and thereon for example CVD or sputtering is employed to form amorphous silicon layer 30.

Figure 38:
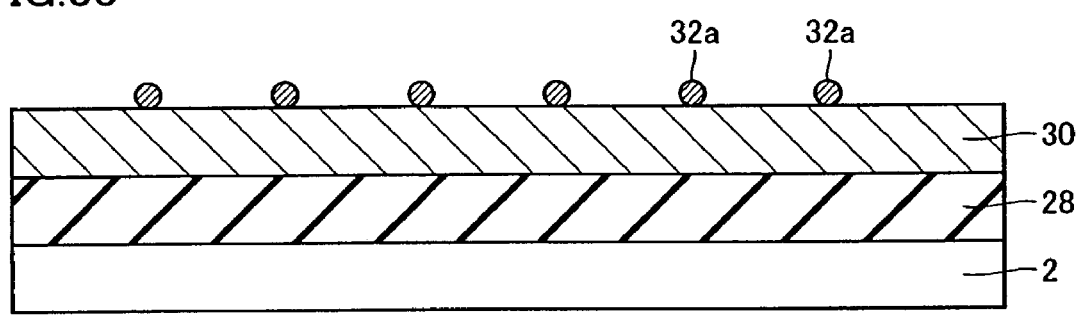
FIG. 38 is a view in cross section showing a step in the second embodiment subsequent to the FIG. 37 step.
Figure 39:
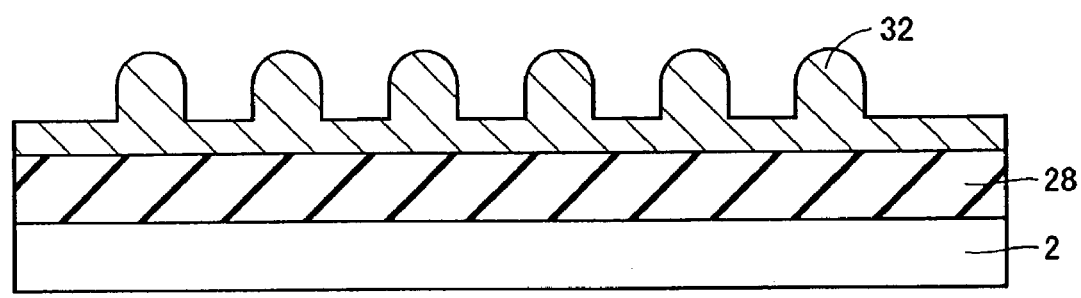
FIG. 39 is a view in cross section showing a step in the second embodiment subsequent to the FIG. 38 step.

Then, as shown in FIG. 38, disilane ($Si_2H_6$) gas is used to form a seed of silicon 32a on amorphous silicon 30. The semiconductor substrate with seed 32a thereon is thermally treated to grow the seed to form a protrusion 32 on a surface of amorphous silicon layer 30 to roughen the surface, as shown in FIG. 39.

The antireflection layer with amorphous silicon having a surface roughened, as well as in the aforementioned semiconductor device, can also prevent an upward reflection of a laser beam radiated in laser-trimming and having arrived at the antireflection layer.

This allows interconnections, semiconductor elements and the like to be arranged adjacent to a region having fuses and the semiconductor device can be reduced in size or highly integrated.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
    a semiconductor substrate having a main surface;
    a fuse formed on said main surface of said semiconductor substrate; and
    an antireflection laser having a surface with depressions and protrusions and underlying said fuse, to receive a laser beam radiated to blow said fuse and having arrived at said antireflection layer, and repeatedly reflect the laser beam between said adjacent protrusions to prevent upward reflection of the laser beam.

2. The semiconductor device according to claim 1, wherein said antireflection layer is formed at a surface of said semiconductor substrate.